United States Patent
Taya et al.

[11] Patent Number: 6,066,852
[45] Date of Patent: May 23, 2000

[54] ELECTRON ENERGY FILTER

[75] Inventors: Shunroku Taya, Mito; Yoshifumi Taniguchi, Hitachinaka, both of Japan

[73] Assignee: Hitachi, Ltd., Tokyo, Japan

[21] Appl. No.: 08/765,914

[22] PCT Filed: Jul. 14, 1995

[86] PCT No.: PCT/JP95/01401

§ 371 Date: Jan. 14, 1997

§ 102(e) Date: Jan. 14, 1997

[87] PCT Pub. No.: WO96/02935

PCT Pub. Date: Feb. 1, 1996

[30] Foreign Application Priority Data

Jul. 15, 1994 [JP] Japan .................................. 6-185140

[51] Int. Cl.[7] .................................................. H01J 37/14
[52] U.S. Cl. ........................... 250/396 ML; 250/396 R; 250/305
[58] Field of Search ............................. 250/311, 397, 250/398, 396 ML, 396 R, 305

[56] References Cited

U.S. PATENT DOCUMENTS

| | | | |
|---|---|---|---|
| 4,312,218 | 1/1982 | Tronc .......................... | 250/396 ML |
| 4,322,622 | 3/1982 | Tronc .......................... | 250/396 ML |
| 4,425,506 | 1/1984 | Brown et al. .................. | 250/396 ML |
| 4,740,704 | 4/1988 | Rose et al. .................... | 250/396 ML |
| 4,760,261 | 7/1988 | Rose et al. .................... | 250/396 ML |
| 4,812,652 | 3/1989 | Egle et al. ..................... | 250/396 ML |
| 5,097,126 | 3/1992 | Krivanek ....................... | 250/397 |
| 5,177,361 | 1/1993 | Krahl et al. ................... | 250/305 |
| 5,585,630 | 12/1996 | Taniguchi et al. ............. | 250/396 ML |

FOREIGN PATENT DOCUMENTS 61-277141  12/1986  Japan .
6-162977   6/1994   Japan .

OTHER PUBLICATIONS

Prez, J.P. Sirven et al, Journal de Physique, Paris, 45, Coll. Cs, pp. 171–174 (1984).

"Computer Program 'TRIO' For Third Order Calculation of Ion Trajectory", T. Matsuo et al, Mass Spectroscopy, vol. 24, No. 1, Mar. 1976, pp. 19–62.

"High–Resolution Imaging Magnetic Energy Filters with Simple Structure", S. Lanio, Optik 73, No. 3, 1986, pp. 99–107.

*Primary Examiner*—Bruce Anderson
*Attorney, Agent, or Firm*—Antonelli, Terry, Stout & Kraus, LLP

[57] ABSTRACT

An electron energy filter includes a first pair of magnetic poles for generating a first deflecting magnetic field and a second pair of magnetic poles for generating a second deflecting magnetic field in the same direction as the first deflecting magnetic field. The incident electrons are deflected about 90° with a trace radius of AM1 through the effect of the first deflecting magnetic field, passed through a free space having a distance DL2 that is about a half of the trace radius AM1 and then are incident to the second deflecting magnetic field. The electrons are deflected about 180° with a trace radius AM2 that is about a half of the curvature radius AM1 and are passed through the free space DL2. Then, the electrons are incident to the first deflecting magnetic field again where those electrons are deflected about 90°. The deflected electrons are traveled like a gamma trace so that those electrons outgo in the same direction as the incident one. This filter so designed is made compact and to have a smaller aberration.

25 Claims, 14 Drawing Sheets

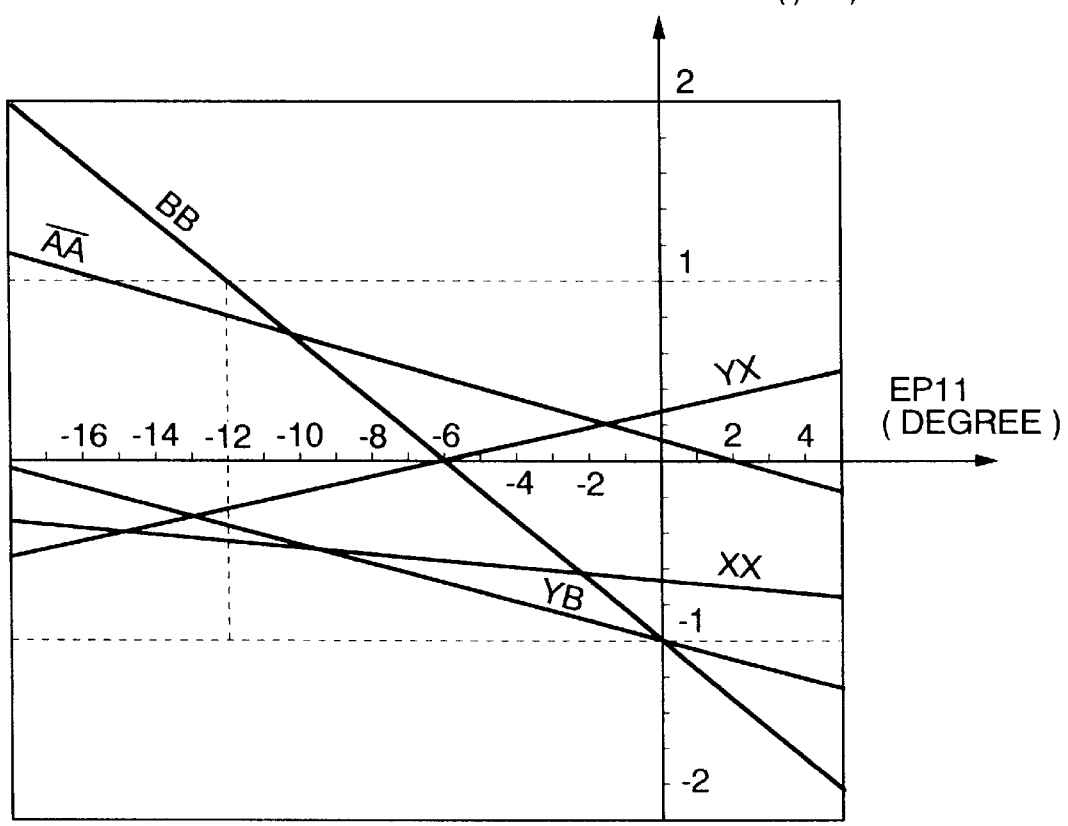

FIG.11 SECONDARY ABERRATION ($\mu$m)

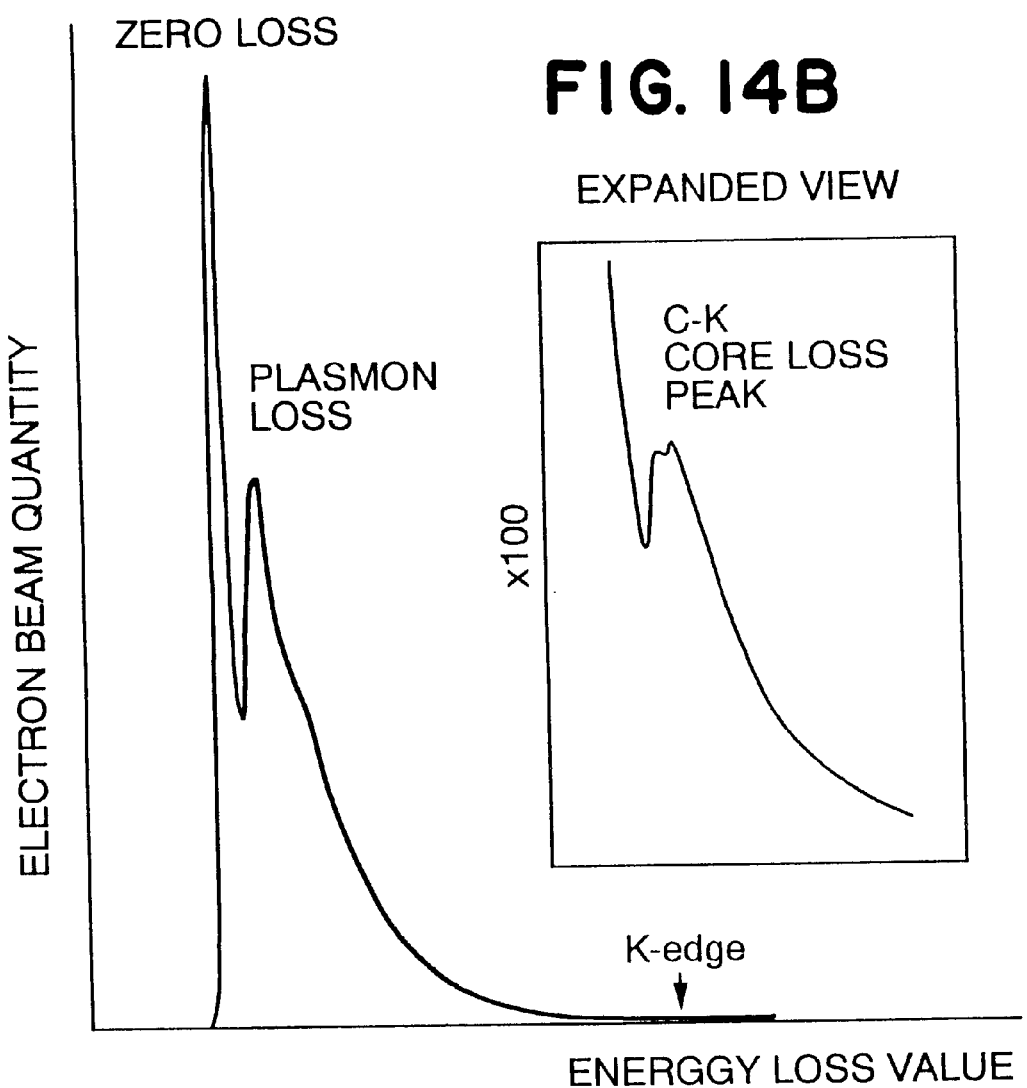

ELECTRON ENERGY FILTER

TECHNICAL FIELD

The present invention relates to an electronic energy filter which is arranged to separate only electrons having specific energy from an electron beam and form an image of those electrons.

BACKGROUND ART

In a transmission electron microscope, electrons transmitted through a specimen suffer from energy loss that is peculiar to one or more elements composing the specimen. To overcome this shortcoming, the electrons transmitted through the specimen are passed through an energy filter for analyzing energy of those electrons, separating only the electrons suffering from the specific energy loss, and forming an image of the separated electrons. The formed image corresponds to a mapping image of one or more specific elements contained in the specimen. Further, the use of only the electrons having specific energy for forming an image allows the energy loss of the electrons caused by the thickness of the specimen to be restricted to only specific electrons. The resulting image has excellent contrast.

For the electron energy filter used for this kind of purpose, there have been known an omega type energy filter (U.S. Pat. No. 4,740,704) and an alpha type energy filter (U.S. Pat. No. 4,760,261).

The omega type energy filter is composed of three electromagnets as shown in FIG. 2. The first electromagnet 1 has an opposite deflecting direction to the second and the third electromagnets 2 and 3. Incident electrons 4 are traced like an omega (Ω) and are fired in the same direction as the incident one, for selecting only the electrons having specific energy loss. As shown, a numeral 5 denotes a crossover point. A numeral 6 denotes an inlet image surface. A numeral 7 denotes an outlet image surface. A numeral 8 denotes an energy dispersion surface.

The alpha type energy filter is composed of three electromagnets 11, 12 and 13 having the same deflecting directions as each other as shown in FIG. 3. Incident electrons 4 are traced like an alpha (α) and finally outgoes in the same direction as the incident one, for selecting only the electrons that suffer from specific energy loss. Another kind of alpha type energy filter is shown in FIG. 4 (Perez, J. P., Sirven, J., Sequela, A., and Lacaze, J. C., Journal de Physique, (Paris), 45, Coll. Cs, 171 to 174 (1984)). This energy filter is constructed so that an electromagnet 14 having a deflecting angle of 70° is located as opposed to the other electromagnet 15 having a deflecting angle of 220° with narrow middle space 16, in which those electromagnets yield the corresponding magnetic field intensities. In the construction, an incident electron beam 4 goes around the inside of the filter for analyzing the energy of the electron beam.

DISCLOSURE OF INVENTION

The electron energy filter is required to form an energy dispersion surface and an image surface with a small aberration. That is, the electrons 4 transmitted through the specimen enter at the crossover point 5 formed on a lens into the electron energy filter, pass through the filter and reach the energy dispersion surface 8 where the electrons having the specific energy are converged in the same direction though the electrons having the other energy are dispersed. On the energy dispersion surface 8, hence, the aberration has to be eliminated in order to restrict a lower resolution of the electrons passing through a slit. Moreover, the image formed on an inlet image surface 6 before the electron energy filter is required to be similarly formed on an outlet image surface point 7. Hence, the aberration has to be reduced to a minimum for suppressing the distortion of the image as much as possible.

A convergence condition of the electron optical system provided in the electron energy filter arranged to use a fanlike electromagnet may be calculated by using a calculation program of an ion optical system used for designing a mass spectrometer. The convergence characteristic up to a three degrees, which considers the effect of an end magnetic field, can be precisely calculated by the calculation program TRIO that is completed by Matuo, Matuda, et al. (T. Matsuo, H. Matusda, Y. Fujita and H. Wollnik; Mass Spectroscopy, Vol. 24, No.1, March 1976)

The electron optical system of the aforementioned conventional electron energy filter does not make sufficient allowance for the effect of the end magnetic field. The image point formed after the passage of the electrons through the electron energy filter is required to make the energy dispersion disappear, converge the image in two directions, and have the magnifications of the images kept at a value of 1. As mentioned below, the electron optical system does not completely meet these conditions.

Assuming that the energy dispersing direction is x and the direction crossed at right angles with the direction x (direction of a magnetic flux) is y, the y-directional convergence is given by the oblique passage of charged particles in the inlet and the outlet end magnetic fields of the fanlike magnetic field. That is, when the angles formed between the vertical plane to the electron beam 30 and the ends of the electromagnets 31 and 32 have the relations of EP11 and EP12 as shown in FIG. 5A (where the angles EP11 and EP12 have positive signs), the electron beam 30 is converted in the y direction as shown in FIG. 5B. On the other hand, the angles formed between the vertical plane to the electron beam 30 and the ends of the electromagnets 31 and 32 have the relations of EP21 and EP22 as shown in FIG. 5C (where the angles EP21 and EP22 have negative signs), the electron beam 30 is dispersed in the y direction as shown in FIG. 5D. By selecting optimal incident and outgoing angles, the distortion and the aberration of the image may be reduced to a minimum.

In the TRIO, the secondary aberration may be represented as follows.

$$x_2 = Xx_1 + A\alpha_1 + D\delta_1 + XXx_1^2 + XAx_1\alpha_1 + AA\alpha_1^2 + \\ XDx_1\delta_1 + AD\alpha_1\delta_1 + DD\delta_1^2 + YYy_1^2 + YBy_1\beta_1 + BB\beta_1^2 \quad (1)$$

$$y_2 = Yy_1 + B\beta_1 + YXy_1x_1 + YAy_1\alpha_1 + \\ YDy_1\delta_1 + BXx\beta_1x_1 + BA\beta_1\alpha_1 + BD\beta_1\delta_1 \quad (2)$$

where x is a beam width in the direction of the energy dispersion caused by the fanlike magnetic field, α is a spread angle, δ is a spread of energy, y is a beam width that is vertical to x, and β is a spread angle in the y-direction. A subscript 1 represents an initial condition of the beam. A subscript 2 represents a beam width of a converged image. X, A, D, Y and B represent a first-order aberration coefficient. XX, XA, AA and the like represent a secondary aberration coefficient.

For the energy filter, it is necessary to meet the following first-order convergence condition for keeping an image point in focus with no distortion caused in the image.

$$X=\pm 1, A=0, D=0, Y=\pm 1, B=0 \quad (3)$$

At the energy dispersion spot, it is necessary to meet the following first-order convergence condition.

$$X=\pm 1, A=0, D\neq 0 \quad (4)$$

Even if the foregoing conditions are met, the resulting energy filter does not offer excellent performance. To keep the distortion of the image minimum, it is necessary to eliminate the secondary aberration. The secondary aberration coefficients XD, AD, DD, YD and BD about the energy width δ may be negligible, because the energy width $\delta_1$ of the electrons are allowed to be restricted to $10^{-4}$ or lower through the slit. Since the other beam spread is as wide as $10^{-3}$, it is necessary to design the electron optical system so that the secondary aberration coefficient may be made far smaller.

The table 1 lists the values of the aberration coefficients calculated by the TRIO in the electron optical systems of the omega type energy filter shown in FIG. 2 and the alpha type energy filter shown in FIGS. 3 and 4. The form parameters of each energy filter required for the calculation are derived from Optik 73, No. 3 (1986) 99–107.

To make the incident direction of the electron beam to the filter the same as the outgoing direction, it is necessary to keep the deflecting angles VM1 and VM2 of the first and the second magnetic fields in the following relation.

$$WM1+WM2/2=180° \quad (5)$$

If the deflecting angle VM1 of the first magnetic field is shifted largely from 90°, the area of the magnetic pole is made larger, so the compact design of the filter is not allowed.

If WM1 and WM2 are substantially 90° and 180°, respectively, the electron beams in the free space are kept in parallel.

TABLE 1

Figure 2:
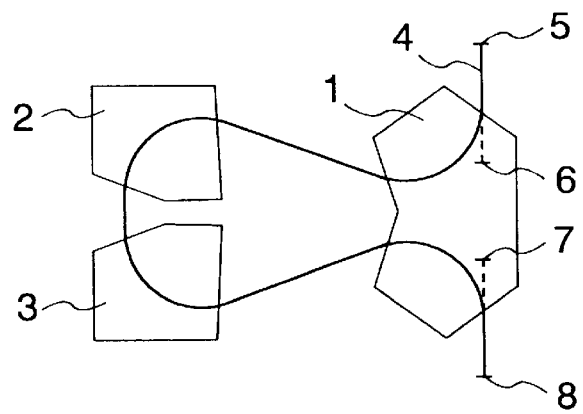
FIG. 2 is a schematic view showing the conventional omega type energy filter.
Figure 3:
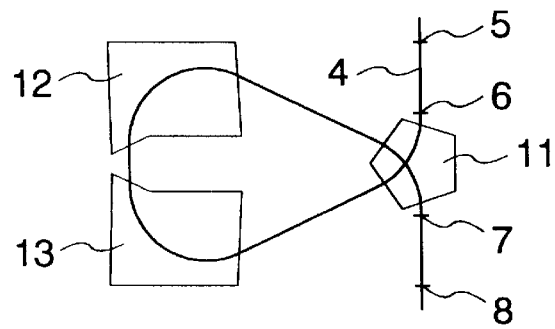
FIG. 3 is a schematic view showing the conventional alpha type energy filter.

| Secondary Aberration Coefficients | | XX | XA | AA | YY | YB | BB | YX | YA | BX |
|---|---|---|---|---|---|---|---|---|---|---|
| OMEGA type | | | | | | | | | | |
| (FIG. 2) | Image Point | −53 | 3.7 | 0.0 | −121 | 15 | −0.3 | 24 | −7.3 | 7.6 |
| | Dispersion Point | −52 | −3.6 | −0.2 | −28 | −4.8 | −0.1 | | | |
| ALPHA type | | | | | | | | | | |
| (FIG. 3) | Image Point | −100 | 6.7 | 0.0 | 70 | −6.8 | 0.1 | −35 | −5.4 | 12 |
| | Dispersion Point | −8 | −4.8 | −0.2 | −120 | −4.1 | −0.2 | | | |
| ALPHA type | | | | | | | | | | |
| (FIG. 4) | Image Point | −46 | 13 | 0.0 | −5500 | 1200 | −64 | −810 | −16 | 110 |
| | Dispersion Point | −30 | −3.8 | −0.5 | −1500 | 500 | 42 | | | |

These values are calculated at an MKS unit. Hence, the aberration is a value of $\mu$m if the beam spread is in the order of $10^{-3}$. If the aberration at an image point is 100 $\mu$m, the image expanded to be 100 times larger through the projecting lens system of the electron microscope has a distortion of 1 cm, which is not an excellent filtered image. In particular, the alpha type energy filter such as Perez offers an image point where the secondary aberration is 5 mm, the first-order magnification Y in the y direction is 28, and the y-directional aberration coefficient B is 3. Hence, the resulting image is not converged and extremely distorted.

The further problems the prior art involves are reduction of magnetic poles in number and compact design, which is due to location of the filter on the way of a mirror body. The conventional systems rather than the alpha type energy filter of Perez, et al. with a large-image distortion need four magnetic poles and thus as many end magnetic fields for the incident and outgoing electron beam as eight. The end magnetic fields may make the beam convergence uncertain. Preferably, they may be smaller in number.

It is an object of the present invention to provide an electron energy filter that is designed compactly with a small number of magnetic poles and offers a more excellent convergence characteristic.

Figure 4:
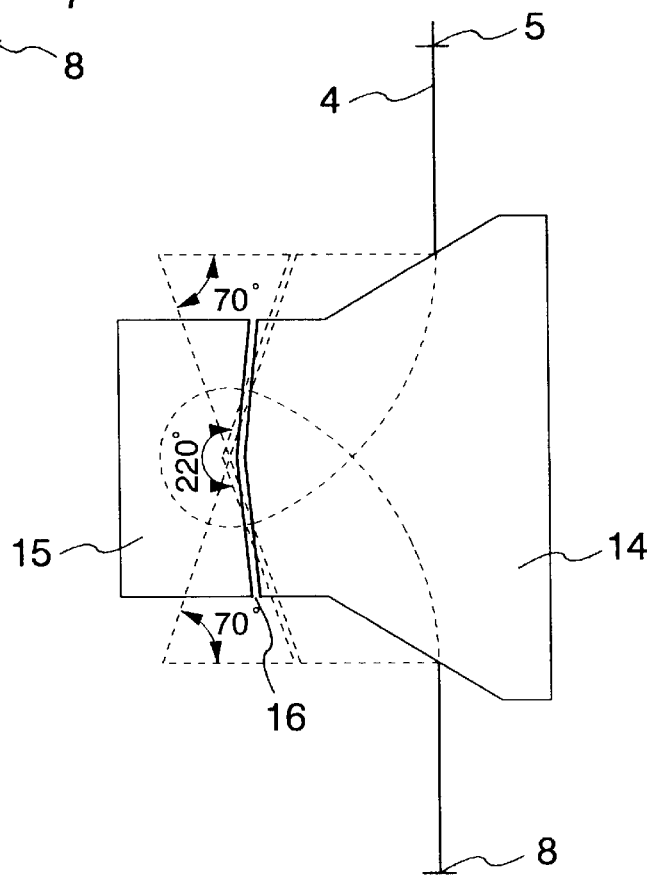
Figure 5A:
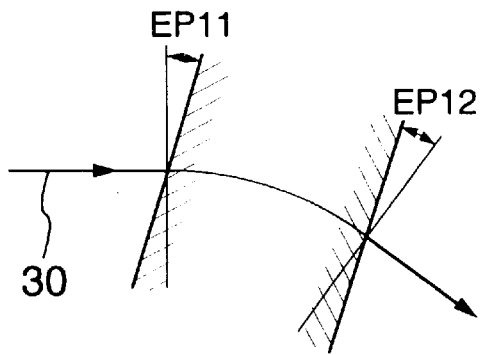
Figure 5B:
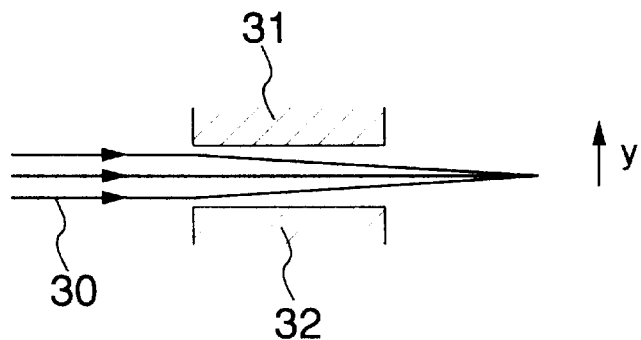
Figure 5C:
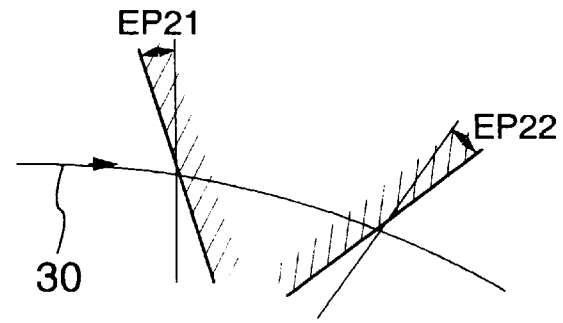
Figure 5D:
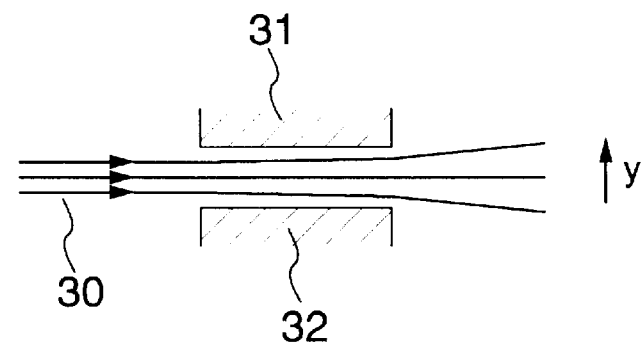
Figure 7:
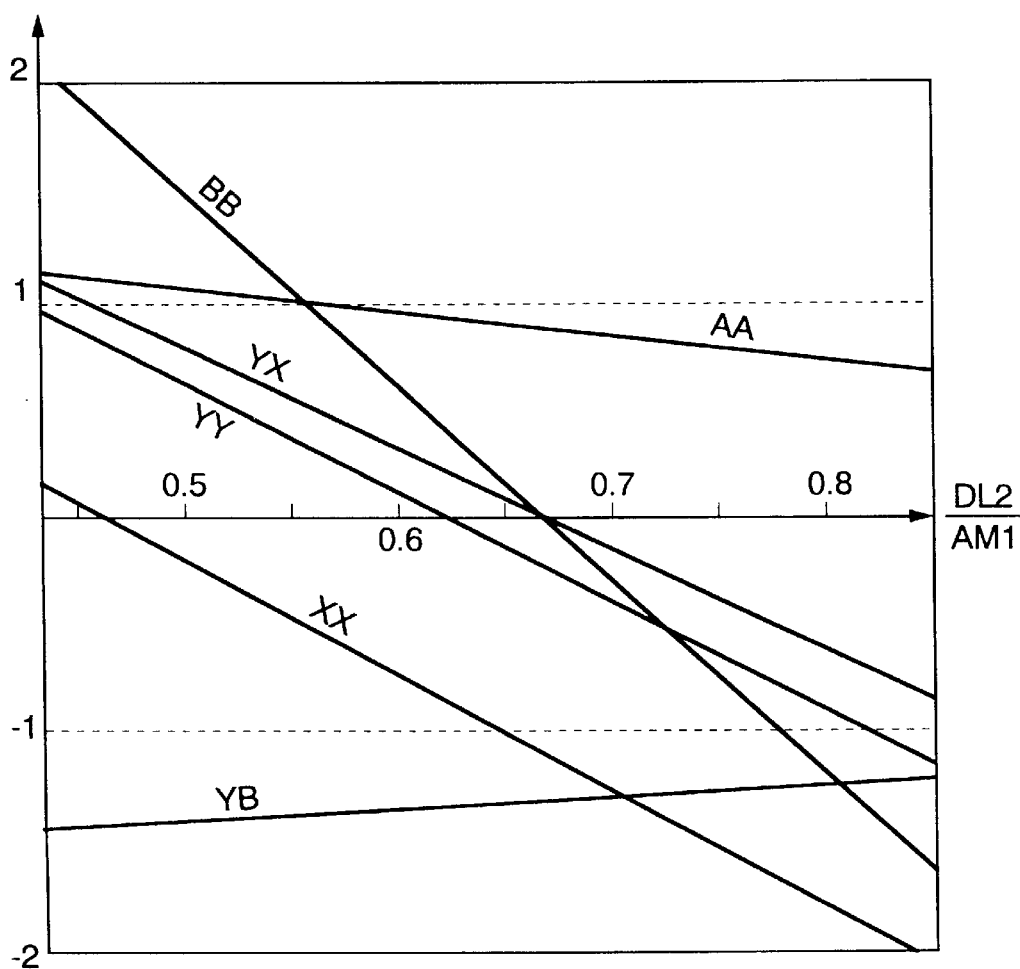
Figure 8:
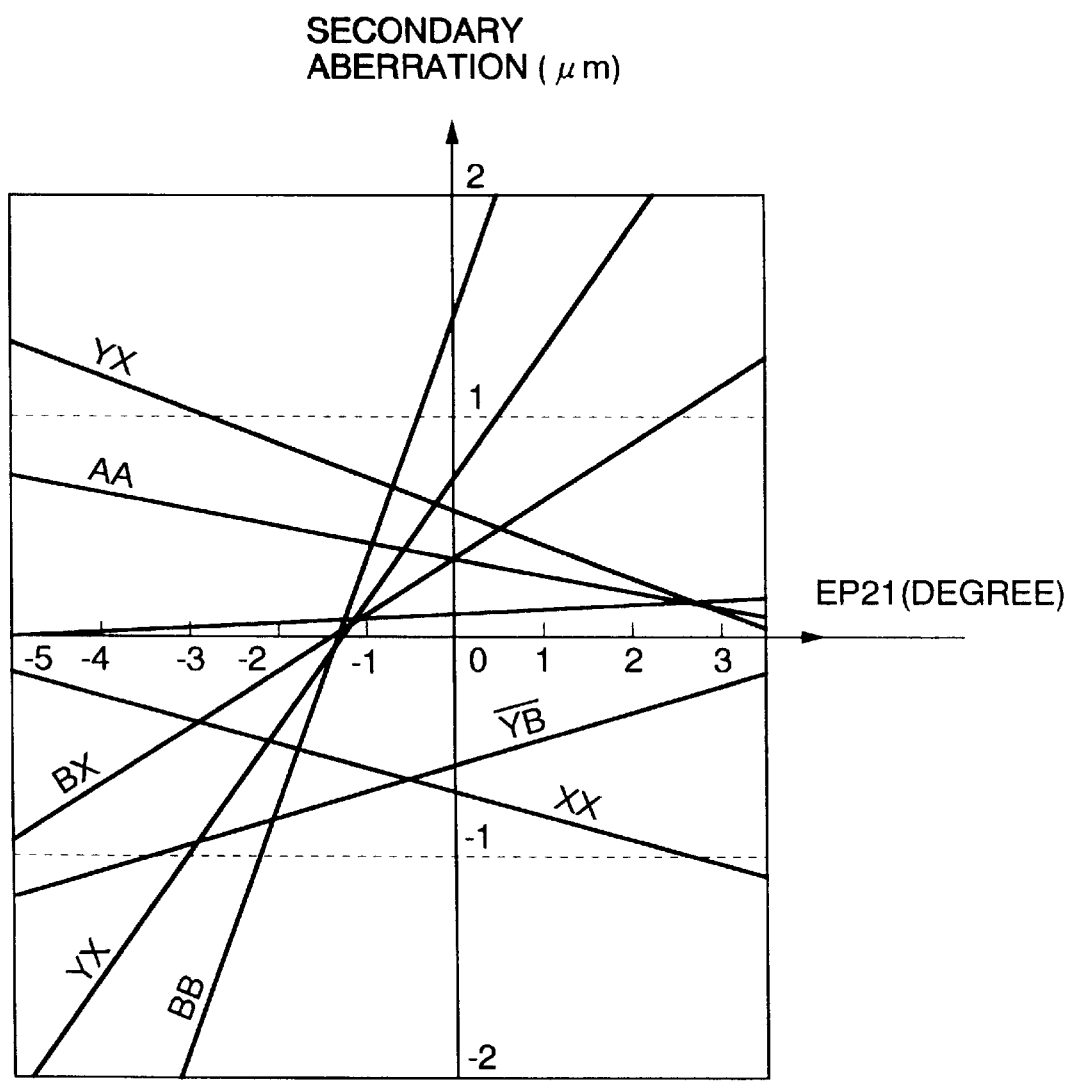
Figure 9:
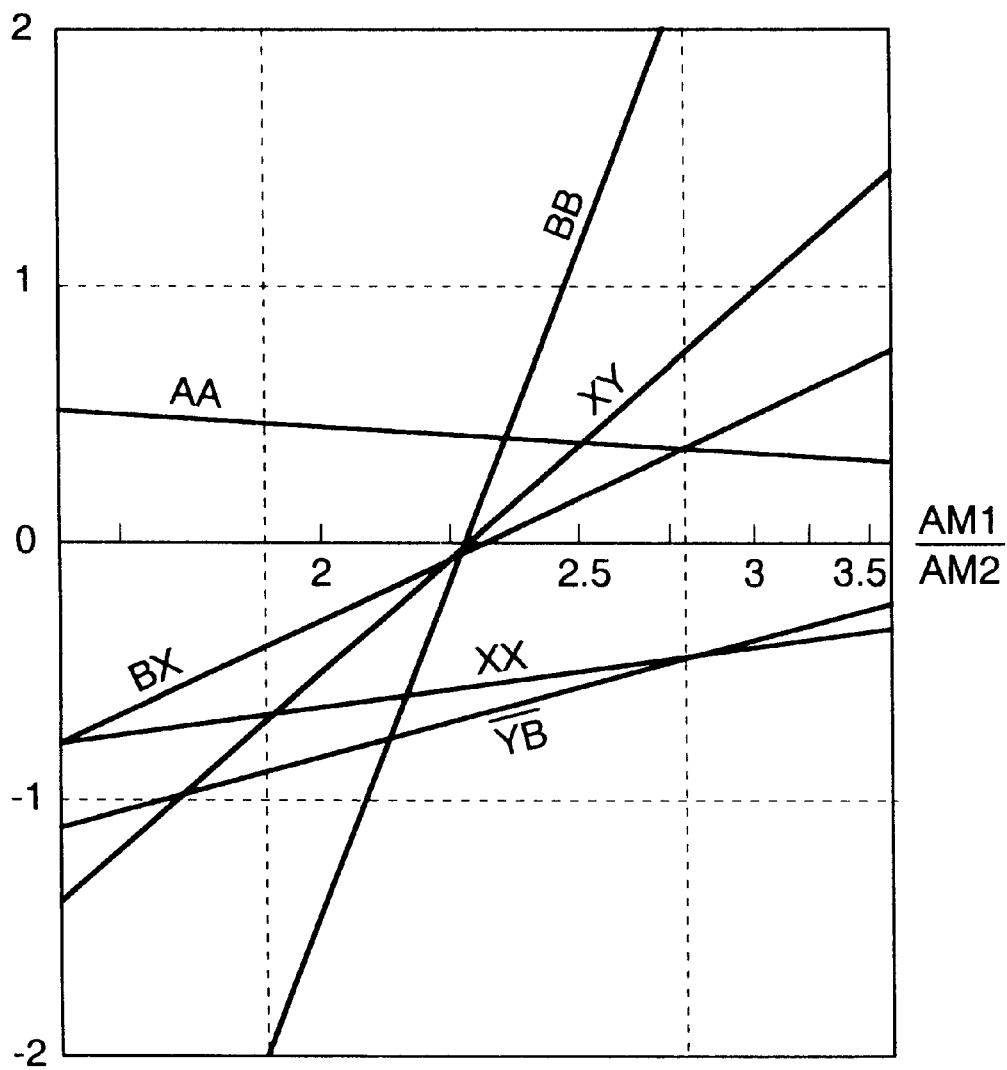
Figure 10:
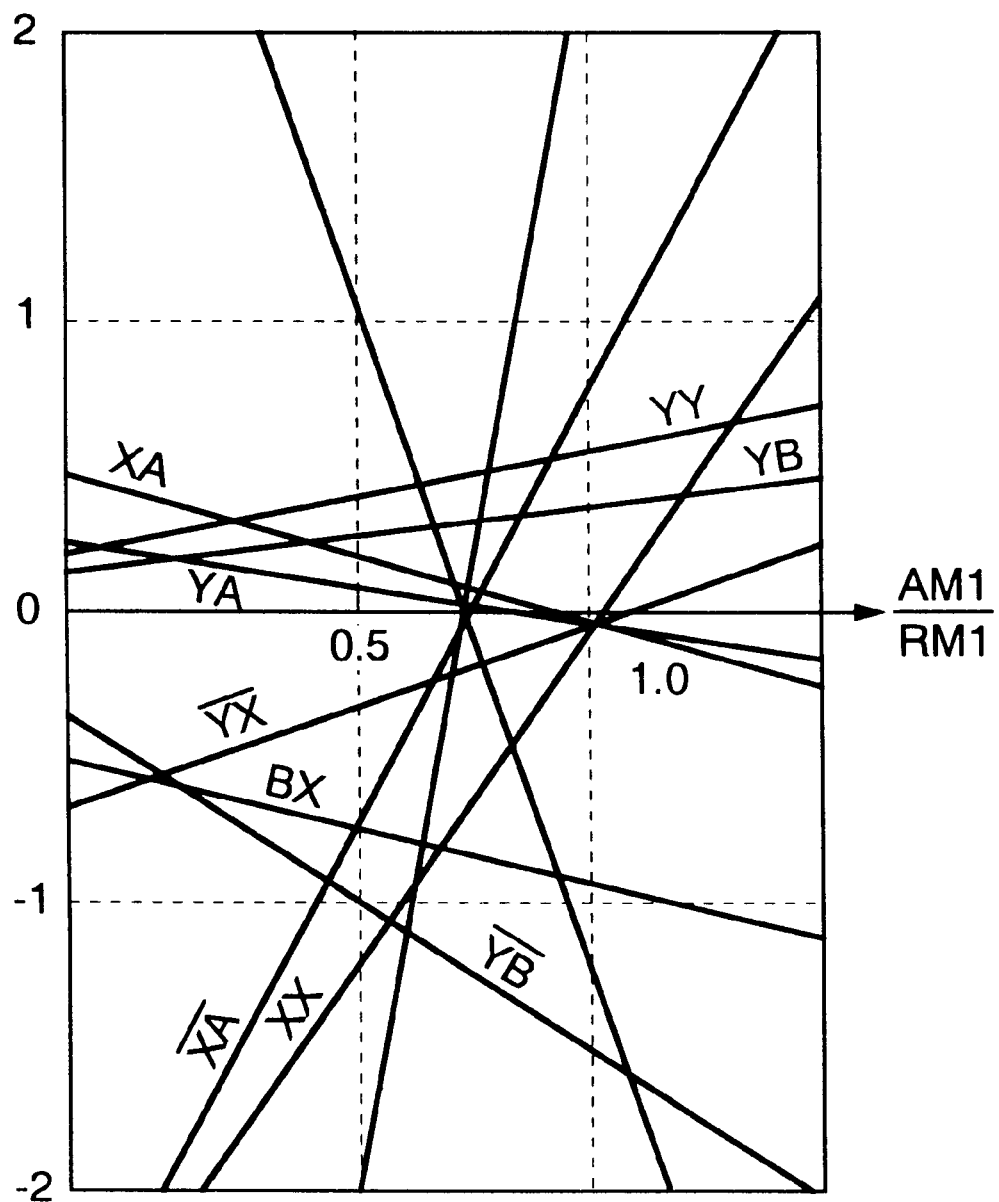
Figure 11:
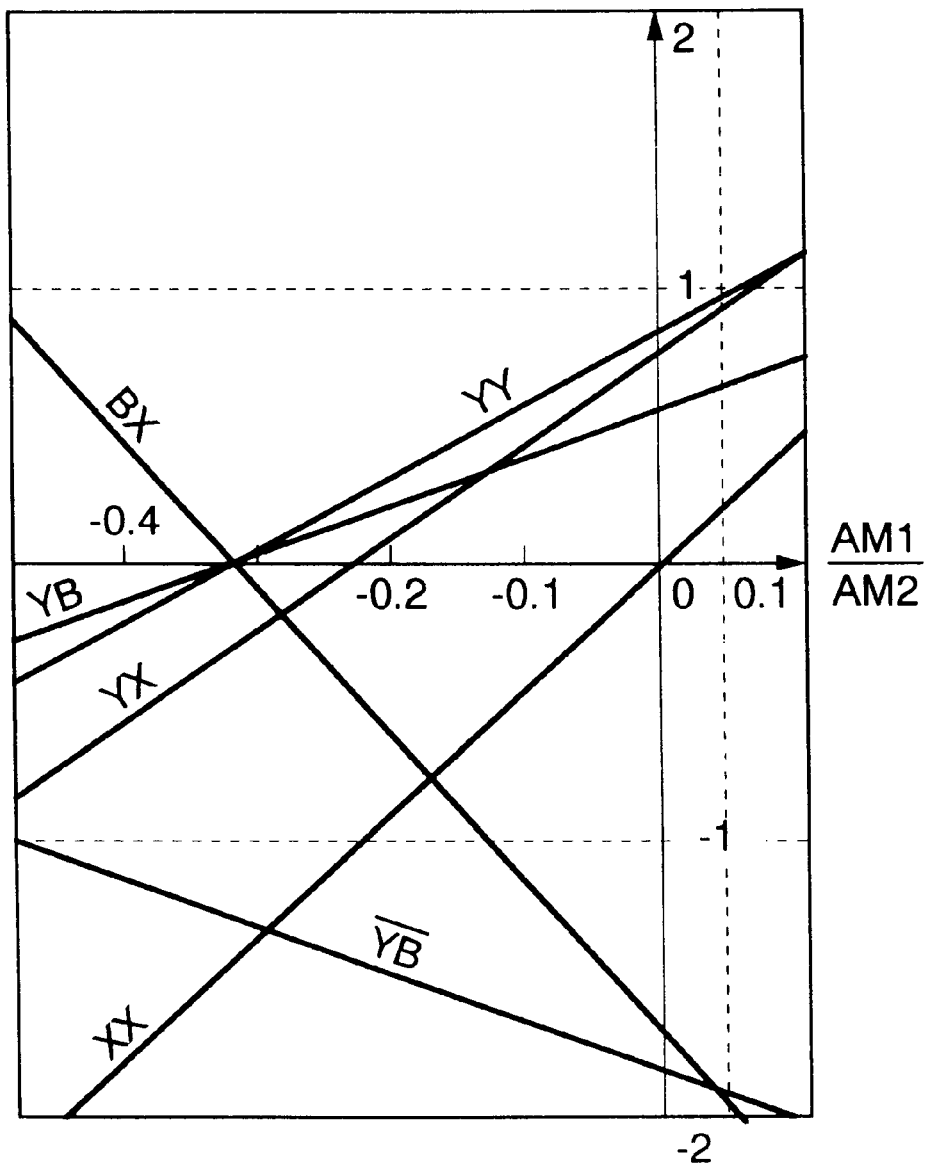
Figure 12:
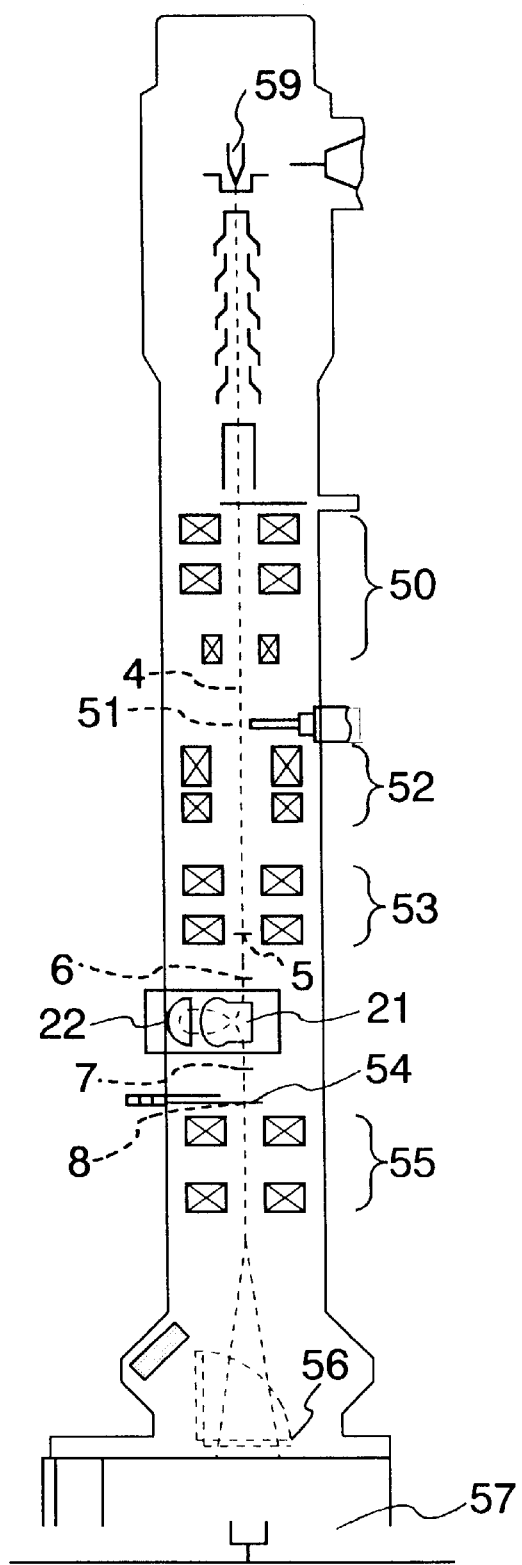
Figure 13:
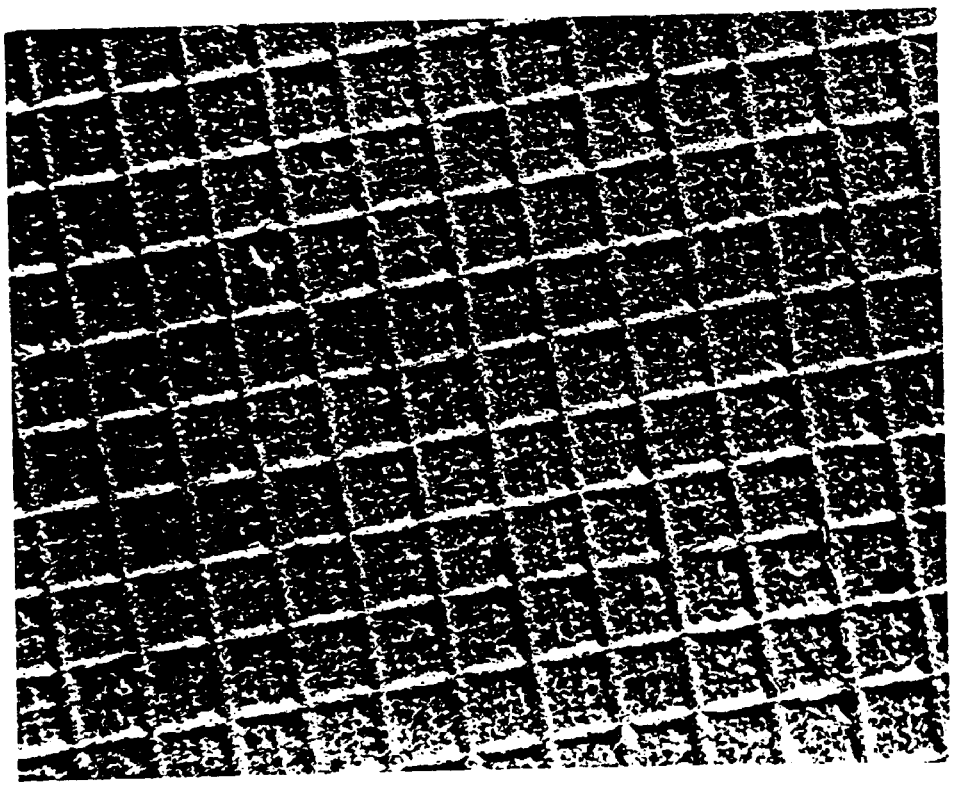
Figure 15A:
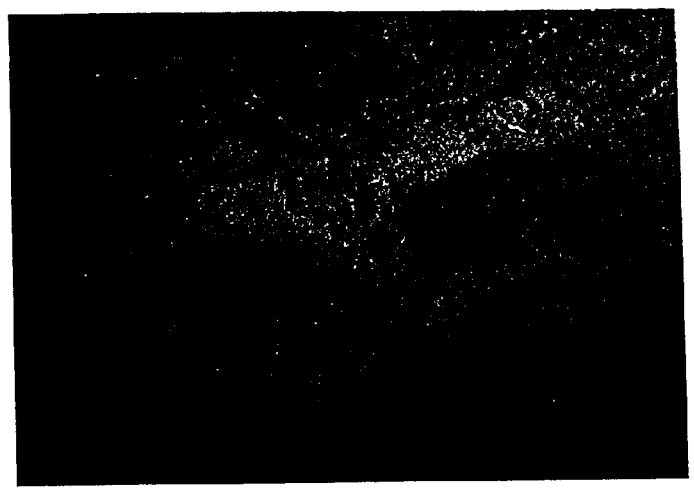
Figure 15B:
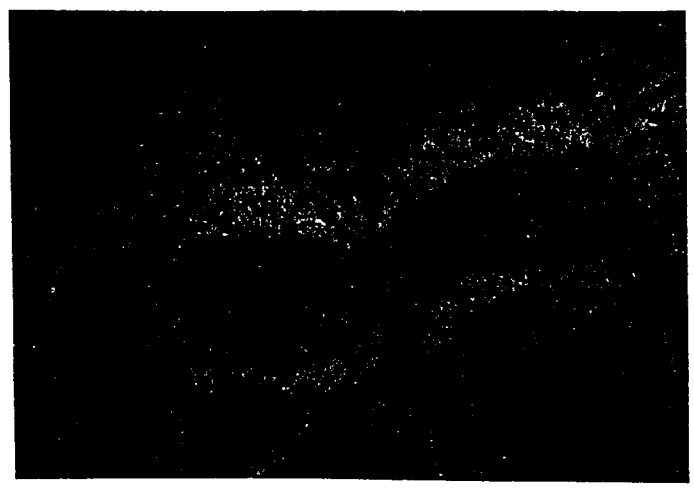
Figure 15C:
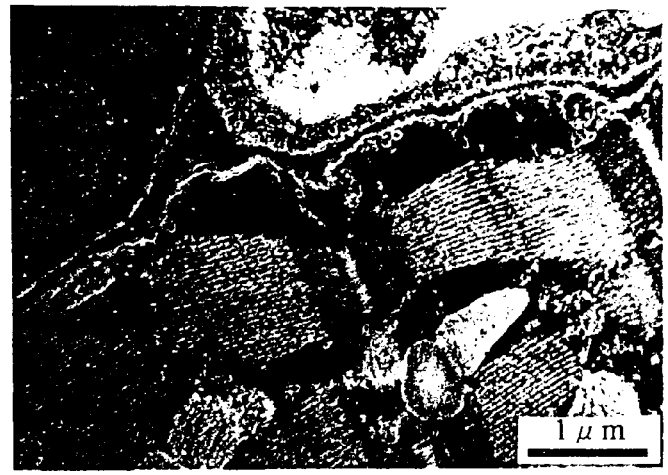
Figure 16:
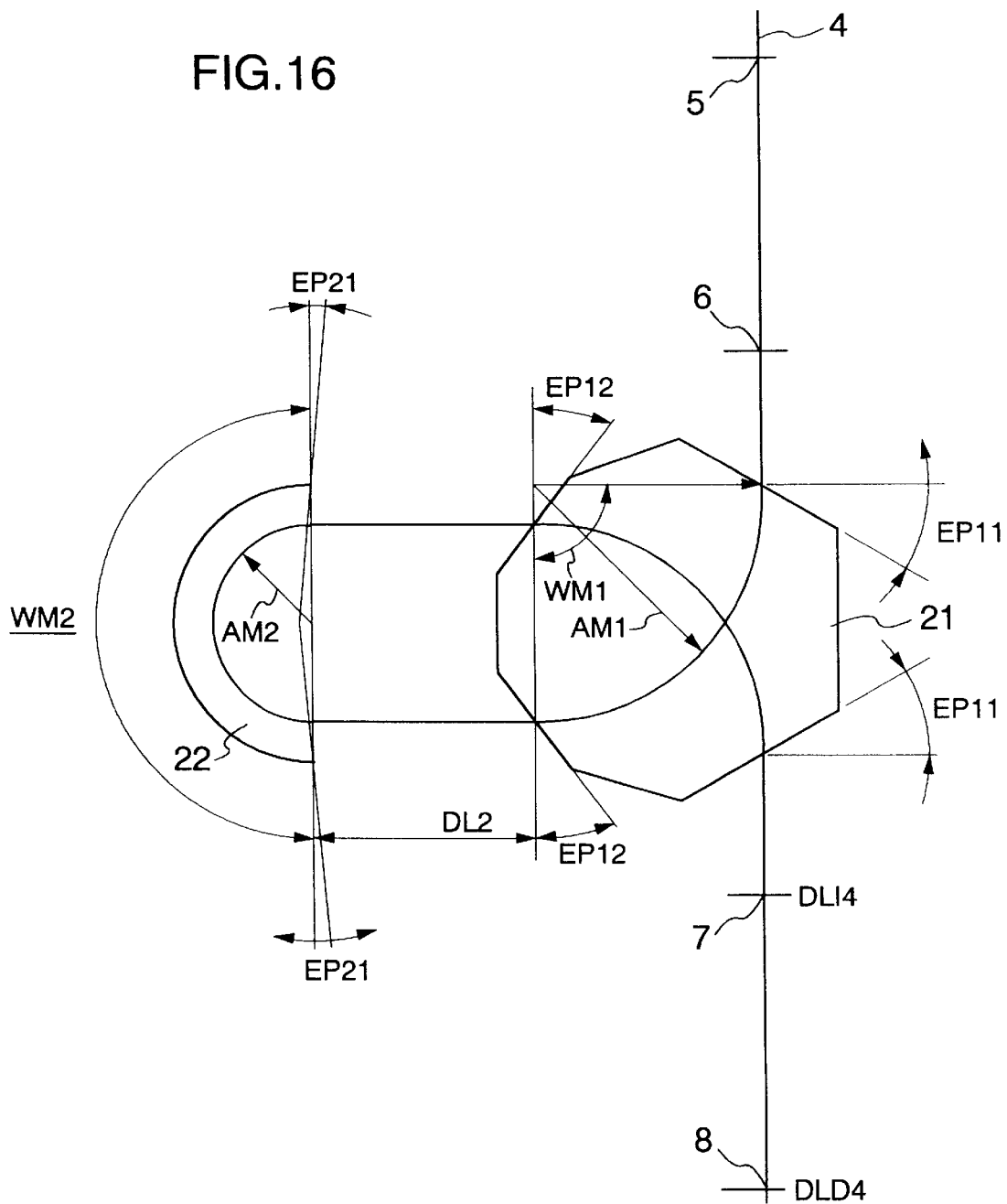

FIG. 4 is a schematic view showing another alpha type energy filter;

FIGS. 5A to 5D are explanatory views showing y-directional convergence of an electron beam caused by the oblique incident and outgoing effect;

FIG. 6 is a graph showing a relation between an incident angle EP11 and a secondary aberration in a first magnetic field;

FIG. 7 is a graph showing a change of a secondary aberration with a ratio of a free space distance to a trace radius of the first magnetic field;

FIG. 8 is a graph showing a relation between the incident angle EP21 any the secondary aberration in the second magnet field;

FIG. 9 is a graph showing a change of a secondary aberration with a ratio of a trace radius of the first magnetic field to that of the second magnetic field;

FIG. 10 is an explanatory view showing a change of a secondary aberration with a ratio of a trace radius of the first magnetic field to a convex radius of an incident end;

FIG. 11 is an explanatory view showing a change of a secondary aberration with a ratio of a track radius of the first magnetic field to a concave radius of an outgoing end;

FIG. 12 is a view showing a construction of an electron microscope provided with an energy filter according to the embodiment of the present invention;

FIG. 13 is a photograph showing an energy-filtered image formed through an electron microscope provided with an electron filter according to the embodiment of the present invention;

FIG. 14A is a graph showing an energy dispersing spectrum caused by the energy filter according to the embodiment of the present invention and FIG. 14B is an expanded view of the C-K core loss peak;

FIGS. 15A to 15C are photographs taken by an electron microscope for showing the compared images energy-filtered by the energy filter according to the embodiment of the present invention; and FIG. 16 is a schematic view showing an energy filter according to another embodiment of the present invention.

EMBODIMENTS

First Embodiment

Figure 1A:
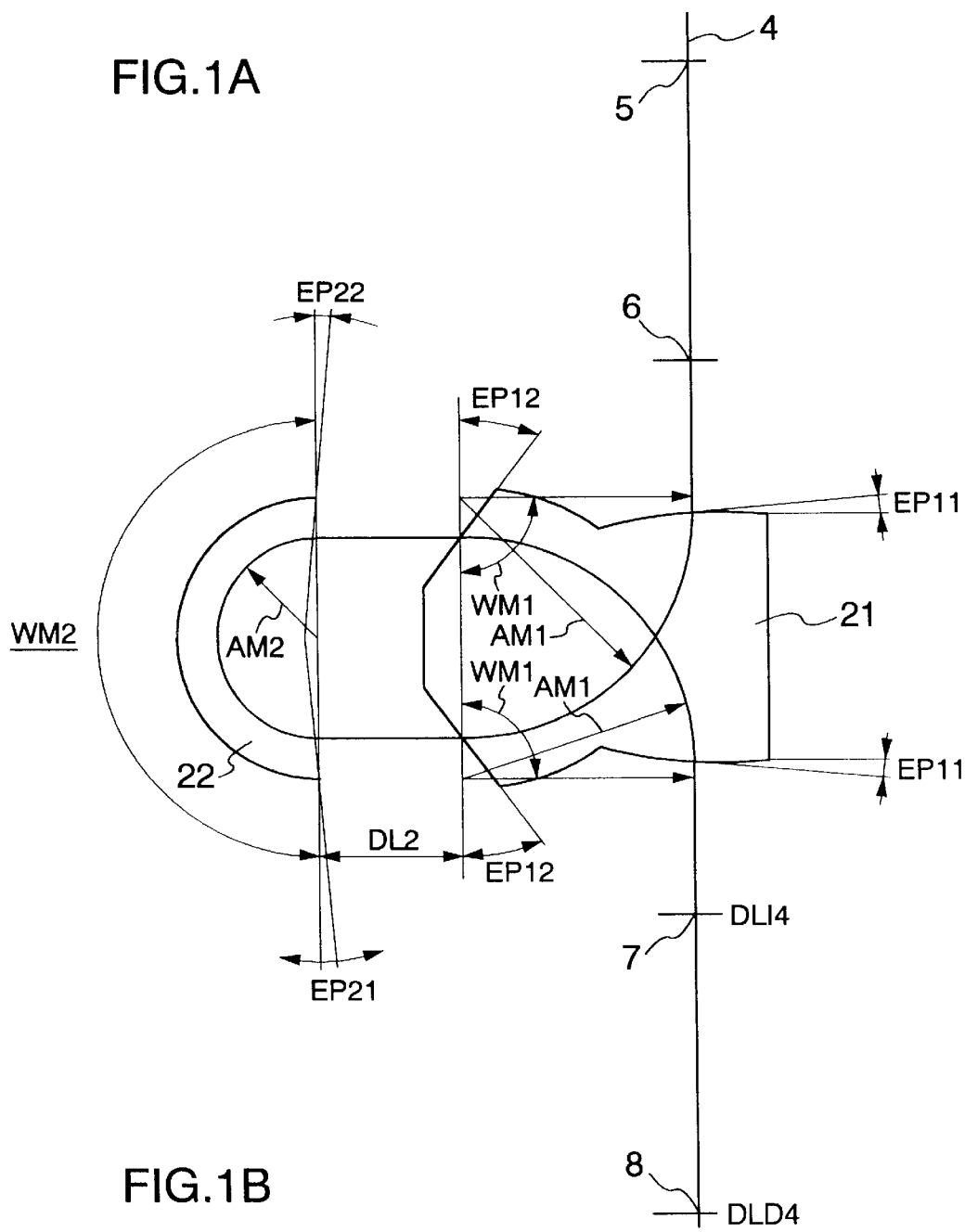
FIG. 1A is a schematic view showing an energy filter according to an embodiment of the present invention.
Figure 1B:
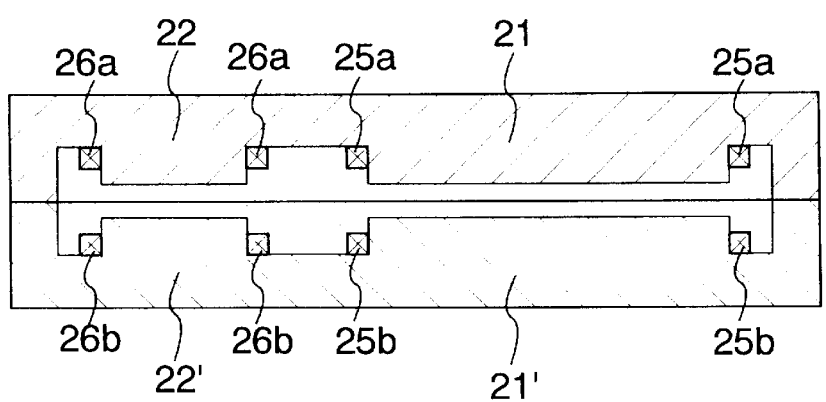
FIG. 1B is a section view showing the same as above.

FIG. 1 is a schematic view showing the magnetic poles of an electron energy filter according to an embodiment of the present invention, in which FIG. 1A is a plane view and FIG. 1B is a central section. An electron beam 4 is deflected through the effect of a first magnetic field generated between a pair of magnetic poles 21 and 21' by virtue of current flowing through coils 25a and 25b and a second magnetic field generated between a pair of magnetic poles 22 and 22' by virtue of current flowing through coils 26a and 26b. After the electron beam 4 is deflected about 90° by virtue of the first magnetic filed yielded by the first pair of magnetic poles 21 and 21', the deflected beam 4 travels straight on a first path and enters into the second magnetic field yielded by the second pair of magnetic poles 22 and 22', in which the beam is deflected 180° in the substantially same direction. Then, the beam travels on the second path in the free space, which is substantially parallel to the first path, and then is again incident to the first magnetic field in which the beam is deflected 90° with the same radius as the first deflection. Hence, the beam is rotated totally 360° and then outgoes in the same direction as the incident one. The trace radius AM2 of the electron beam in the second magnetic field is about half as long as the track radius AM1 in the first magnetic field, for reducing the magnetic poles 21 and 22 in area. In the filter constructed as above, the electron beam is traced as a gamma (γ).

The y-directional convergence effect is brought about by the oblique outgoing and re-incident of the beam from and to the magnetic poles 21 and 21' for generating the first magnetic field. The deflecting angle WM1 and the central trace radius AM1 in the first magnetic field, the deflecting angle VM2 and the central trace radius AM2 in the second magnetic field, and the distance DL2 from the outgoing point of the first magnetic field to the incident point of the second magnetic field are selected to keep the following numerical range, for meeting the foregoing expressions (3) and (4).

$$80° \leq WM1 \leq 100° \tag{6}$$

$$2 \leq AM1/AM2 \leq 3 \tag{7}$$

$$160° \leq WM2 \leq 200° \tag{8}$$

$$0.4AM1 \leq DL2 \leq 0.8AM1, \text{Preferably } 0.5AM1 \leq DL2 \leq 0.7AM1 \tag{9}$$

More preferably, WM1 is substantially 90°. WM2 is substantially 180°. AM1/AM2 is substantially 2. DL2 is substantially equal to AM2.

The initial incident angle EP11 and the outgoing angle EP12 of the electron beam in the first magnetic field and the incident and the outgoing angles EP21 of the electron beam in the second magnetic field are selected to keep the following numerical range, for reducing the secondary aberration to a minimum.

$$-12° \leq EP1 \leq 0° \tag{10}$$

$$30° \leq EP12 \leq 40° \tag{11}$$

$$-3° \leq EP21 \leq 1° \tag{12}$$

In another preferable embodiment, EP11 is substantially 42°, EP12 is substantially 11.8°, and EP21 is substantially 30°.

The magnetic pole ends of the initial incident point and the outgoing point of the electron beam in the first magnetic pole are worked as a convex and a concave planes in order to reduce the secondary aberration to a minimum. The curvature radii RM1 and RM2 of these planes are selected to keep the following numerical range, where a sign of + indicates the curvature is convex and a sign of − indicates the curvature is concave.

Incident Convex Plane:

$$0.5 \leq AM1/RM1 \leq 0.9 \tag{13}$$

Outgoing Concave Plane:

$$-0.5 \leq AM1/RM2 \leq 0.05 \tag{14}$$

In another preferred embodiment, AM1/RM1 is substantially 1.0 and AM1/RM2 is substantially 0.7.

The representative parameters of the electron optical system used in this embodiment are as follows.

$EP11=-6°, RM1=0.063 \text{ m}, AM1=0.05 \text{ m},$ $WM1=90°, EP12=33.4°, RM2=-0.2 \text{ m},$ $DL2=0.03 \text{ m}, EP21=-1.5°, AM2=0.022 \text{ m},$ $$WM2=180°, EP22=EP21=-1.5° \tag{15}$$

Under these parameters, the first-order aberration coefficients at the image point DL14 and the dispersion point DLD4 are as follows.

$DL14=0.028 \text{ m}, X=1.0, A=0.0, D=0.0,$ $Y=-1.0, B=0.0$ $DLD4=0.094 \text{ m}, X=-1.0, A=0.0, D=0.1,$ $$Y=-1.6, B=-0.17 \tag{16}$$

These first-order aberration coefficients meet the foregoing expressions (3) and (4).

The secondary aberration coefficients of the electron energy filter constructed to use these parameters are listed in the following Table 2.

| Secondary Aberration Coefficients of the Invention | XX | XA | AA | YY | YB | BB | YX | YA | BX |
|---|---|---|---|---|---|---|---|---|---|
| Image Points | −8.8 | 0.6 | 0.00 | 1.3 | 0.3 | 0.00 | 14 | 0.1 | 0.03 |
| Dispersion Points | 1.4 | 0.8 | 0.03 | −40 | −4.3 | 0.02 | — | — | — |

As is obvious from the Table 2, as compared with the conventional omega and alpha types, the secondary aberration of the image point 7 is reduced down to 1/10 or lower. The secondary aberration at the dispersion point 8 is greatly reduced.

The optima condition of the electron optical system provided in the energy filter according to this embodiment is determined by varying the parameters. As an example, FIGS. 6 to 11 show the variation of the secondary aberration brought about by an incident angle EP11 of the first magnetic field, a ratio (DL2/AM1) of a free space distance between the first and the second magnetic fields to a trace radius of the first magnetic field, a ratio (AM1/RM1) of a trace radius of the first magnetic field to a convex radius of an incident end, and a ratio (AM1/RM2) of a trace radius of the first magnetic field to a concave radius of an outgoing end. The secondary aberration shown in FIGS. 6 to 11 are indicated by using the secondary aberration coefficients of the expressions (1) and (2). IN actual, they are represented in $\mu$m on the assumption of the beam spread appearing in using this filter for practical purpose. The aberration with a bar on it is a value on the dispersion point. The aberration with no bar on it is a value on the image point.

The optimal form is determined on the result of simulating those values. The allowance for the secondary aberration is not unconditionally determined. It depends on the purpose of the device itself. As is apparent from FIGS. 6 to 11, the secondary aberration is gradually varied with respect to the abovementoned parameters. It is practically negligible if it stays in the range of ±2 $\mu$m.

As is understood from FIG. 6, if the incident angle EP11 of the first magnetic field is defined in the range of −18° to 5°, the secondary aberration may be reduced to a value within ±2 $\mu$m. If it is defined in the range of −12° to 0°, it may be further reduced to a value within ±1 $\mu$m. As is understood from FIG. 7, it is possible to suppress the secondary aberration within ±2 $\mu$m if a ratio (DL2/AM1) of a middle free space distance to a trace radius of the first magnetic field is set in the range of 0.4 to 0.8. Further, as is understood from FIG. 8, it is possible to suppress the secondary aberration within ±2 $\mu$m if a ratio (AM1/AM2) of a trace radius of the first magnetic field to a trace radius of the second magnetic field is set in the range of 2 to 3. Moreover, as is understood from FIG. 10, it is possible to suppress the secondary aberration within ±2 $\mu$m if a ratio (AM1/RM1) of the trace radius of the first magnetic field to a convex radius of the incident end is set in the range of 0.5 to 0.9. As is understood from FIG. 11, it is possible to suppress the secondary aberration within ±2 $\mu$m if a ratio (AM1/RM2) of the trace radius of the first magnetic field to the concave radius of the outgoing end is set in the range of −0.5 to 0.05.

After the electron energy filter of this embodiment is attached with the known electron microscope (manufactured by Hitach, Ltd., Model: H-8100), the function of the energy filter was checked. FIG. 12 shows the construction of the electron microscope attached with the energy filter. In FIG. 12, this electron energy filter has in-column magnetic poles 21 and 22 located between a middle lens system 53 and a projecting lens system 55. An electron beam 4 is fired by an electron gun 59 and then converged through the converging lens system 50. The converted beam 4 transmits through a specimen 51 and then is converged to a crossover point 5 through the middle lens system 53. The converted beam goes around the inside of the energy filter and then converted again at an energy dispersion point 8. The electrons having respective kinds of energy are dispersed through the effect of the magnetic fields of the magnetic poles 21 and 22 so that those electrons having a different magnitude of energy are transformed into the corresponding line spectrums. A variable slit 54 is located at the energy dispersion point 8 for selectively adjusting the energy width of the line spectrum to a specific one.

On the other hand, the incident image surface 6 formed through the middle lens system 53 is formed again on the outlet image surface 7 through the effect of the energy filter. This image is not made vague by the so-called achromatic effect, that is, the effect that the dispersions are offset by the energy filter if the electrons have the corresponding energy width.

The electron beam selected as the specific energy through the variable slit 54 passes a projecting lens 55, through which an outlet image 7 is expansively formed on a fluorescent plate 56. A numeral 57 denotes a detector.

The electron energy filter provides two magnetic poles 21 and 22 that are independent of each other. Each magnetic pole has a coil wound therearound. The magnetic pole yields a magnetic field for an acceleration voltage of the electrons so that the electron beam travels along a specific trace.

FIG. 13 shows an example of a photo representing an energy-filtered image formed by the electron microscope attached with the energy filter according to this embodiment. The used specimen is a carbon grating film about 0.5-$\mu$m square. The selected energy is electrons with zero loss. As is obvious from FIG. 13, though the electron beam travels around the inside of the energy filter, the image is represented as a square.

When detecting the electron beam transmitting through the slit under the constant magnetic field and the increased voltage for accelerating the electrons, the electron beam is represented as an energy spectrum of the transmitted electrons, which is illustrated in FIGS. 14A and 14B.

The conventional electron microscope is served to form all the electrons having any magnitude of energy contained in this energy spectrum as an image and expand it.

The electron energy filter enables to select only the electrons having a specific magnitude of energy. FIGS. 15A to 15C show electron microscopic photos of a non-dyeing specimen with a thickness of about 70 $\mu$m where a cardiac muscle of a mouse is double-fixed by glutaraldehyde and osmium tetroxide. FIG. 15A shows an ordinary image of the electron microscope. FIG. 15A shows an image formed of only the electrons with zero loss selected through the electron energy filter. FIG. 15C is a loss image formed of only the electrons close to −250 eV.

As is obvious from the comparison of these photos, the electron microscope attached with the energy filter of this embodiment may offer an image with improved contrast rather than the conventional electron microscope. Further, in the former, by selecting the core-loss electrons, it is possible to form a vivid mapping image of specific elements and improve a function of an analytic electron microscope.

As set forth above, the resulting electron energy filter may be compactly designed with a small number of magnetic poles and is low in aberration and excellent in a converging characteristic.

Second Embodiment

In order to meet the expressions (3) and (4), the deflecting angle WM1 and the central trace radius AM1 in the first magnetic field, the deflecting angle WM2 and the central trace radius AM2 in the second magnetic field, the distance DL2 from the outgoing point of the first magnetic field to the incident point of the second magnetic field are selected in the following numerical ranges.

$$80° \leq WM1 \leq 100°, \text{ preferably, substantially } 90° \quad (17)$$

$$1.5\ AM2 \leq AM1 \leq 2.5\ AM2, \quad (18)$$

$$160° \leq WM2 \leq 200°, \text{ preferably, substantially } 180° \quad (19)$$

$$Am1 \leq DL2 \leq 2\ AM1 \quad (20)$$

In order to reduce the secondary aberration to a minimum, the first incident angle EP11 and the outgoing angle EP12 of the electron beam in the first magnetic field and the incident and outgoing angle EP21 of the electron beam in the second magnetic field are selected in the following numerical ranges.

$$20° \leq EP11 \leq 30° \quad (21)$$

$$20° \leq EP12 \leq 30° \quad (22)$$

$$-3° \leq EP21 \leq 1° \quad (23)$$

Further, the magnetic pole end of the first incident point and the outgoing point of the electron beam in the first magnetic field is worked as a convex or a concave. These curvature radii RM1 and RM2 are selected in the following numerical ranges.

$$\text{Incident Plane } -1 \leq AM1/RM1 \leq 1 \quad (24)$$

$$\text{Outgoing Plane } -1 \leq AM1/RM2 \leq 1 \quad (25)$$

where a sign of + represents the convex curvature and a sign of − represents the concave curvature.

The energy filter is designed so that the electron beam that outgoes at the crossover point is, again, focused at one point on the energy dispersion surface. This design is based on the following disadvantages appearing if the electron beam is linearly focused without focusing it at one point, (1) It is necessary to locate the energy spectrum and the energy selecting slit strictly in parallel to each other. In order to suppress the adverse effect of the shadow of dust adhering to the slit, it is necessary to make the slit tabular in a wide range.

(2) It is likely that an imperfection in an axial condition may slip the electron beam out of the condition of X=Y=1 on the image surface.

(3) To observe a grating pattern, the image surface is formed on the energy dispersion surface. Since the x-axial focal distance is different from the y-axial focal distance, it is difficult to match the focal points of the image surface to each other.

The representative parameters of the electron optical system of this embodiment are indicated as follows.

$$EP11=22.8°, RM1=0 \text{ mm}, AM1=45 \text{ mm},$$

$$WM1=90°, EP12=27.7°, RM2=0 \text{ mm},$$

$$DL2=70.4 \text{ mm}, EP21=0°, AM2=22 \text{ mm},$$

$$WM2=180° \quad (26)$$

In this case, the first-order aberration coefficients at the image point DLI4 and the energy dispersion point DLD4 are indicated as follows, where DLI4 is a distance from the final magnetic pole end to the image point and DLD4 is a distance from the final magnetic pole end to the energy dispersion point.

$$DL14=30.4 \text{ mm}, X=1.0, A=0.0, D=0.0,$$

$$Y=-1.0, B=0.0$$

$$DLD4=102.8 \text{ mm}, X=-1.0, A=0.0, D=0.16,$$

$$Y=1.0, B=0.0 \quad (27)$$

These first-order aberration coefficients meet the expressions (3) and (4).

The secondary aberration coefficients of the electron energy filter of this embodiment calculated by the TRIO are illustrated in Table 3. Those secondary aberration coefficients are small enough to inhibit the distorted or vague energy spectrum and image and are maintained in the allowable range. Further, the electron energy filter includes four deflecting magnetic fields, that is, the number of the magnetic poles is as small as four. The electron energy filter is excellent in workability and constructed compactly.

TABLE 3

Secondary Aberration Coefficient of Electron Energy Filter of the Invention

| Aberration Coefficient | XX | XA | AA | YY | YB | BB | YX | YA | BX | BA |
|---|---|---|---|---|---|---|---|---|---|---|
| Image Point | −43.4 | 3.14 | 0.00 | −37.9 | 2.74 | 0.00 | 41.1 | −2.41 | −1.48 | 0.00 |
| Dispersion Point | −105.3 | −12.1 | −0.44 | −138.8 | −18.3 | −0.67 | 287.5 | 18.1 | 17.9 | 1.24 |

Third Embodiment

In order to meet the expressions (3) and (4), the deflecting angle WM1 and the central trace radius AM1 in the first magnetic field, the deflecting angle WM2 and the central trace radius AM2 in the second magnetic field, and a distance from the outgoing point of the first magnetic field to the incident point of the second magnetic field are selected in the following numerical ranges.

$$75° \leq WM1 \leq 85°, \text{ preferably, substantially } 80° \qquad (28)$$

$$1.5AM2 \leq AM1 \leq 2.5AM2 \qquad (29)$$

$$190° \leq WM2 \leq 210°, \text{ preferably, substantially } 200° \qquad (30)$$

$$0.8AM1 \leq DL2 \leq 2.5AM1 \qquad (31)$$

In order to reduce the secondary aberration to a minimum, the first incident angle EP11 and the outgoing angle EP12 of the electron beam in the first magnetic field and the incident and outgoing angle EP21 of the electron beam in the second magnetic field are selected in the following numerical range.

$$15° \leq EP11 \leq 15° \qquad (32)$$

$$30° \leq EP12 \leq 45° \qquad (33)$$

$$-7° \leq EP21 \leq 3° \qquad (34)$$

Further, the magnetic pole end of the first incident point and the outgoing point of the electron beam in the first magnetic field is worked as a convex or a concave for reducing the secondary aberration to a minimum. These curvature radii RM11 and RM12 are selected in the following numerical range, where a sign of + represents the convex curvature and a sign of − represents the concave curvature.

$$\text{Incident Plane: } 0.5 \leq AM1/RM11 \leq 1.5 \qquad (35)$$

$$\text{Outgoing Plane: } -1.5 \leq AM1/RM12 \leq -0.5 \qquad (36)$$

Likewise, the curvature radius RM21 of the magnetic pole end between the incident point and the outgoing point of the electron beam in the second magnetic field is selected in the following numerical range by the trace radius AM2.

$$0.5 \leq AM2/RM21 \leq 1.5 \qquad (37)$$

This electron energy filter is designed so that the electron beam that outgoes at the crossover point is, again, focused at one point on the energy dispersion surface. If the electron beam is focused not at one point but linearly, the following disadvantages take place.

(1) It is necessary to locate the energy spectrum and the energy selecting slit strictly in parallel to each other. Further, to suppress the adverse effect of the shadow of dust adhering to the slit, it is necessary to make the slit tabular in a wide range.

(2) It is likely that an imperfection in an axial condition may slip the electron beam out of the condition of X=Y=1.

(3) To observe the grating pattern, the image surface is formed on the energy dispersion surface. However, since the x-axial focal distance is different from the y-axial focal distance, it is difficult to match the focal points of the image surface to each other.

The representative parameters of the electron optical system of this embodiment are indicated as follows.

$$AM1=45 \text{ mm}, WM1=80°, EP11=1.18°,$$

$$EP12=36.9°, RM11=47.01 \text{ mm},$$

$$RM12=-47.52 \text{ mm}, DL2=73.65 \text{ mm},$$

$$AM2=24 \text{ mm}, WM2=200°, EP21=0° \qquad (38)$$

In this case, the first-order aberration coefficients at the image point DLI4 and the energy dispersion point DLD4 are indicated as follows, where DLI4 is a distance from the final magnetic pole end to the image point and DLD4 is a distance from the final magnetic pole end to the energy dispersion point.

$$DL14=9.83 \text{ mm}, X=1.0, A=0.0,$$

$$D=0.0, Y=1.0, B=0.0$$

$$DLD4=92.34 \text{ mm}, X=-1.0, A=0.0,$$

$$D=0.11, Y=1.0, B=0.0 \qquad (39)$$

These first-order aberration coefficients meet the expressions (3) and (4).

The secondary aberration coefficients of the electron energy filter according to this embodiment, which are calculated by the TRIO, are listed in Table 4. Those secondary aberration coefficients are small enough to inhibit the distorted or vague energy spectrum or image and maintained in the allowable range. This electron energy filter is constructed to have two deflecting magnetic fields for realizing the foregoing optical system, that is, the number of the magnetic poles is as small as four. The electron energy filter is excellent in workability and is constructed compactly.

TABLE 4

Secondary Aberration Coefficient of Electron Energy Filter of the Invention

| Aberration Coefficient | XX | XA | AA | YY | YB | BB | YX | YA | BX | BA |
|---|---|---|---|---|---|---|---|---|---|---|
| Image Point | −43.4 | 3.14 | 0.00 | −37.9 | 2.74 | 0.00 | 41.1 | −2.41 | −1.48 | 0.00 |
| Dispersion Point | −105.3 | −12.1 | −0.44 | −138.3 | −18.5 | −0.67 | 287.5 | 18.1 | 17.9 | 1.24 |

Fourth Embodiment

In order to meet the expressions (3) and (4), the deflecting angle WM1 and the central trace radius AM1 in the first magnetic field, the deflecting angle WM2 and the central trace radius AM2 in the second magnetic field, and the distance DL2 from the outgoing point of the first magnetic field to the incident point of the second magnetic field are selected in the following numerical range.

$$80° \leq WM1 \leq 100°, \text{ preferably, substantially } 90° \qquad (40)$$

$$1.5AM2 \leq AM1 \leq 2.5AM2 \qquad (41)$$

$$160° \leq WM2 \leq 200°, \text{ preferably, substantially } 180° \qquad (42)$$

$$AM1 \leq DL2 \leq 2AM1 \qquad (43)$$

In order to reduce the secondary aberration to a minimum, the first incident angle EP11 and the outgoing angle EP12 of the electron beam in the first magnetic field and the incident and outgoing angle EP21 of the electron beam in the second magnetic field are selected in the following numerical ranges.

$$38° \leq EP11 \leq 45° \qquad (44)$$

$$8° \leq EP12 \leq 16° \qquad (45)$$

$$25° \leq EP21 \leq 35° \qquad (46)$$

Further, the magnetic pole end between the first incident point and the outgoing point of the electron beam in the first magnetic field is worked as a concave or a convex for reducing the secondary aberration to a minimum. These curvature radii RM11 and RM12 are selected in the following numerical ranges, where a sign of + represents a convex curvature and a sign of − represents a concave curvature.

$$\text{Incident Plane } -0.2 \leq AM1/RM11 \leq 0 \qquad (47)$$

$$\text{Outgoing Plane } 0 \leq AM1/RM12 \leq 1 \qquad (48)$$

$$\text{Incident and Outgoing Plane } 0.5 \leq AM1/RM21 \leq 1.5 \qquad (49)$$

The electron energy filter is designed so that the electron beam that outgoes at the crossover point is, again, focused at one point on the energy dispersion surface. If the electron beam is focused not at one point but linearly, the following disadvantages take place.

(1) It is necessary to locate the energy spectrum and the energy selecting slit strictly in parallel to each other. Further, to suppress the adverse effect of the shadow of the dust adhering to the slit, it is also necessary to make the slit tabular in a wide range.

(2) It is likely that an imperfection in an axial condition may slip the electron beam out of the condition of X=Y=1 on the image surface.

(3) To observe the grating pattern, the image surface is formed on the energy dispersion surface. However, since the x-axial focal distance is different from the y-axial focal distance, it is difficult to match the focal points of the image surface to each other.

Next, the representative parameters of the electron optical system of this embodiment are indicated as follows.

$$EP11=42.1°, AM1=32 \text{ mm},$$

$$AM1/RM11=-0.1455, WM1=90°,$$

$$EP12=11.77°, AM1/RM12=0.668,$$

$$DL2=50.92 \text{ mm}, EP21=30°, AM2=18 \text{ mm},$$

$$WM2=180°, AM2/RM21=AM2/RM22=1.0 \qquad (50)$$

FIG. 16 shows a schematic construction of the filter constructed to use these parameters, in which the same members of FIG. 16 as those of FIG. 1A have the same reference numbers and thus are not descriptive herein.

In this case, the first-order aberration coefficients at the image point DLI4 and the energy dispersion point DLD4 are indicated as follows, where DLI4 is a distance from the final magnetic pole end to the image point and DLD4 is a distance from the final magnetic pole end to the energy dispersion point.

$$DL14=42.1 \text{ mm}, X=1.0, A=0.0, D=0.0,$$

$$Y=1.0, B=0.0$$

$$DLD4=111.8 \text{ mm}, X=-1.0, A=0.0, D=0.2,$$

$$Y=-1.0, B=0.0 \qquad (51)$$

These first-order aberration coefficients meet the expressions (3) and (4).

The secondary aberration coefficients of the electron energy filter according to this embodiment, which are calculated by the TRIO, are listed in Table 5. Those secondary aberration coefficients are small enough to inhibit the distorted or vague energy spectrum and image and thus maintained in an allowable range. Further, the electron energy filter is constructed to have two deflecting magnetic fields for realizing the foregoing optical system, that is, the number of the magnetic poles is as small as four. The electron energy filter is excellent in workability and is constructed compactly.

TABLE 5

Secondary Aberration Coefficient of Electron Energy Filter of the Invention

| Aberration Coefficient | XX | XA | AA | YY | YB | BB | YX | YA | BX | BA |
|---|---|---|---|---|---|---|---|---|---|---|
| Image Point | −2.22 | 0.17 | 0.00 | −73.2 | 5.2 | 0.00 | 6.18 | 1.19 | 2.45 | 0.08 |
| Dispersion Point | −1.06 | 0.026 | 0.00 | −47.9 | 0.19 | 0.00 | 253 | 17.7 | 19.9 | 1.02 |

We claim:

1. An electron energy filter for deflecting electrons in vacuum through the effect of magnetic fields, filtering only the electrons having a specific magnitude of energy, and forming an image of said electrons, comprising:

a first pair of magnetic poles for generating a first deflecting magnetic field and a second pair of magnetic poles for generating a second deflecting magnetic field directed in the same direction as said first deflecting magnetic field; and wherein after an electron beam is incident to said first pair of magnetic poles, said electron beam is deflected a first deflecting angle WM1 with a first trace radius AM1 through the effect of said first deflecting magnetic field, passed through a free space having a distance DL2 causing no magnetic field and then is incident to said second deflecting magnetic field, after that, said electron beam is deflected a second deflecting angle WM2 with a second trace radius AM2, passed through said free space having the thickness DL2 causing no magnetic field and again is incident to said first deflecting magnetic field, after that, said electron beam is deflected said first deflecting angle WM1 with said first trace radius AM1 and then outgoes in the substantially same direction as the incident one of said electron beam to said first deflecting magnetic field, and said first trace radius AM1, said second trace radius AM2, said first deflecting angle WM1, said second deflecting angle WM2, and said free space distance DL2 meet the following relation of $80° \leq WM1 \leq 100°$
$2\,AM2 \leq AM1 \leq 3\,AM2$
$160° \leq WM2 \leq 200°$
$0.5\,AM1 \leq DL2$.

2. An electron energy filter as claimed in claim 1, wherein a first incident angle EP11 and a first outgoing angle EP12 of said electron beam against said first deflecting magnetic field and an incident and outgoing angle EP21 of said electron beam against said second deflecting magnetic field meet the following relation of $-12° \leq EP11 \leq 0°$
$30° \leq EP12 \leq 40°$
$-3° \leq EP21 \leq 1°$.

3. An electron energy filter as claimed in claim 2, wherein a magnetic pole end at a first incident point of said electron beam against said first deflecting magnetic field has a curvature radius of RM1, a magnetic pole end at a first outgoing point has a curvature radius of RM2, and said curvature radii RM1 and RM2 meet the following relation of $0.5 \leq AM1/RM1 \leq 0.9$
$-0.5 \leq AM1/RM2 \leq 0.05$.

4. An electron energy filter as claimed in claim 1, wherein said first incident angle EP11 is about 42°, said first outgoing angle EP12 is about 11.8°, and said incident and outgoing angle EP21 against said second deflecting magnetic field is about 30°.

5. An electron energy filter as claimed in claim 4, wherein a magnetic pole end at the incident point of said electron beam against said first deflecting magnetic field has a curvature radius of RM1, a magnetic pole end at the outgoing point has a curvature radius of RM2, and aid curvature radii RM1 and RM2 meet the following relation of $AM1/RM1=1.0$
$AM1/RM2=0.7$.

6. An electron energy filter as claimed in claim 1, wherein said first deflecting angle WM1 is about 90°, said second deflecting angle WM2 is about 180°, and the distance DL2 of said free space is longer than about a half of said first trace radius AM1.

7. An electron energy filter as claimed in claim 1, wherein said first deflecting angle WM1 is about 90°, said second deflecting angle WM2 is about 180°, and the distance DL2 of said free space is substantially equal to said first trace radius AM1.

8. A transmission electron microscope including said electron energy filter claimed in claim 1.

9. An electron energy filter for deflecting electrons in vacuum through the effect of magnetic fields, filtering only electrons having a specific magnitude of energy, and forming an image of said electrons, comprising:

a first pair of magnetic poles (21) for generating a first deflecting magnetic field and a second pair of magnetic poles (22) for generating a second deflecting magnetic field in the same direction of said first deflecting magnetic field; and wherein incident electrons are deflected a first deflecting angle WM1 with a first trace radius AM1 through the effect of said first deflecting magnetic field, passed through a free space having a distance DL2 causing no magnetic field, and is incident to said second deflecting magnetic field, after that, said electrons are deflected a second deflecting angle WM2 with a second trace radius AM2, passed through said free space having the distance DL2 causing no magnetic field and is again incident to said first deflecting magnetic field, then, said electrons are deflected said first deflecting angle WM1 with said first trace radius AM1 and outgoes in the substantially same direction as the incident one to said first deflecting magnetic field, and said first trace radius AM1, said second trace radius AM2, said first deflecting angle WM1, said second deflecting angle WM2 and the distance DL2 of said free space meet the following relation of $80° \leq WM1 \leq 100°$
$1.5\,AM2 \leq AM1 \leq 2.5\,AM2$
$160° \leq WM2 \leq 200°$
$2\,AM1 \leq DL2 \leq AM1$.

10. An electron energy filter as claimed in claim 9, wherein a first incident angle EP11 and a first outgoing angle EP12 of said electron beam against said first deflecting magnetic field and an incident and outgoing angle EP21 of said electron beam against said second deflecting magnetic field meet the following relation of $20° \leq EP11 \leq 30°$
$20° \leq EP12 \leq 30°$
$-3° \leq EP21 \leq 1°$.

11. An electron energy filter as claimed in claim 10, wherein a magnetic pole end at a first incident point of said electron beam against said first deflecting magnetic field has a curvature radius of RM1, a magnetic pole end at a first outgoing point of said electron beam against said first deflecting magnetic field has a curvature radius of RM2, and said curvature radii RM1 and RM2 meet the following relation of $-1 \leq AM1/RM1 \leq 1$
$-1 \leq AM1/RM2 \leq 1$.

12. An electron energy filter as claimed in claim 9, wherein said first deflecting angle WM1 is about 90°, said second deflecting angle WM2 is about 180°, and the distance DL2 of said free space is longer than said first trace radius AM1.

13. An electron energy filter as claimed in claim 9, wherein a first incident angle EP11 and a first outgoing angle EP12 of said electron beam against said first deflecting magnetic field and an incident and outgoing angle EP21 of said electron beam against said second deflecting magnetic field meet the following relation of $38° \leq EP11 \leq 45°$
$8° \leq EP12 \leq 16°$
$25° \leq EP21 \leq 35°$.

14. An electron energy filter as claimed in claim 13, wherein a magnetic pole end at a first incident point of said electron beam against said first deflecting magnetic field has a curvature radius of RM11, a magnetic pole end at a first outgoing point has a curvature radius of RM12, a magnetic pole end at an incident point and an outgoing point of said electron beam against said second deflecting magnetic field has a curvature radius of RM21, and said curvature radii RM11, RM12 and RM21 meet the following relation of $-0.2 \leq AM1/RM11 \leq 0$
$0 \leq AM1/RM12 \leq 1$
$0.5 \leq AM1/RM21 \leq 1.5$.

15. A transmission electron microscope including said electron energy filter as claimed in claim 9.

16. An electron energy filter for deflecting electrons in vacuum through the effect of magnetic fields, filtering only the electrons having a specific magnitude of energy, and forming an image of said electrons, comprising:

a first pair of magnetic poles (21) for generating a first deflecting magnetic field and a second pair of magnetic poles (22) for generating a second deflecting magnetic field in the same direction as said first deflecting magnetic field; and wherein after an electron beam is incident to said first pair of magnetic poles (21), said electron beam is deflected a first deflecting angle WM1 with a first trance radius AM1 through the effect of said first deflecting magnetic field, passed through a free space having a distance DL2 causing no magnetic field, and then is incident to said second deflecting magnetic field, after that, said electron beam is deflected a second deflecting angle WM2 with a second trace radius AM2, passed through said free space having the distance Dl2 causing no magnetic field, and then is again incident to said first deflecting magnetic field, then, said electron beam is deflected said first deflecting angle WM1 with said first trace radius AM1 and outgoes in the substantially same direction as the incident direction of said electron beam to said first deflecting magnetic field, and said first trace radius AM1, said second trace radius AM2, said first deflecting angle WM1, said second deflecting angle WM2, and the distance DL2 of said free space meet the following relation of $75° \leq WM1 \leq 85°$ $1.5\ AM2 \leq AM1 \leq 2.5\ AM2$ $190° \leq WM2 \leq 210°$ $0.8\ AM1 \leq DL2 \leq 2.5\ AM1$.

17. An electron energy filter as claimed in claim 16, wherein a first incident angle EP11 and a first outgoing angle EP12 of said electron beam against said first deflecting magnetic field and an incident and outgoing angle EP21 of said electron beam against said second deflecting magnetic field meet the following relation of $-15° \leq EP11 \leq 15°$ $30° \leq EP12 \leq 45°$ $-7° \leq EP21 \leq 3°$.

18. An electron energy filter as claimed in claim 17, wherein a magnetic pole end at a first incident point of said electron beam against said first deflecting magnetic field has a curvature radius of RM11, a magnetic pole end at a first outgoing point of said electron beam against said first deflecting magnetic field has a curvature radius of RM12, a magnetic pole end at an incident and outgoing point of said electron beam against said second deflecting magnetic field has a curvature radius of Rm21, said curvature radii RM11, RM12 and RM21 meet the following relation of $0.5 \leq AM1/RM11 \leq 1.5$ $-1.5 \leq AM1/RM12 \leq -0.5$ $0.5 \leq AM1/RM21 \leq 1.5$.

19. An electron energy filter as claimed in claim 16, wherein said first deflecting angle WM1 is about 80°, said second deflecting angle WM2 is about 200°, and the distance DL2 of said free space is longer than said first trace radius AM1.

20. A transmission electron microscope including said electron energy filter as claimed in claim 16.

21. An electron energy filter for deflecting electrons and filtering only the electrons having a specific magnitude of energy, comprising:

means for generating a first deflecting magnetic field, means for generating a second deflecting magnetic field, and a free space on which said magnetic fields of said means have no substantial effect; and wherein incident electrons are deflected a first deflecting angle WM1 with a first trace radius AM1 through the effect of said first deflecting magnetic field, passed through a first path of said free space, and then are incident to said second deflecting magnetic field, after that, said electrons are deflected a second deflecting angle WM2 with a second trace radius AM2, passed through a second path of said free space, said second path being substantially in parallel to said first path, and are incident to said first deflecting magnetic field, then, said electrons are deflected said first deflecting angle WM1 with said first trace radius AM1 and outgo in the substantially same direction as the incident direction of said electrons to said first deflecting magnetic field, said outgo electrons due to said first deflection magnetic field being deflected to the substantially same direction as the incident direction of said electrons incident onto said first deflecting magnetic field.

22. An electron energy filter as claimed in claim 21, wherein said first path is substantially equal in distance to said second path and said distance DL2 is longer than about a half of said first trace radius AM1.

23. An electron energy filter as claimed in claim 21, wherein said first path is substantially equal in distance to said second distance and said distance Dl2 and said first trace radius AM1 meet the following relation of $AM1 \leq DL2 \leq 2\ AM$.

24. A transmission electron microscope including said electron energy filter as claimed in claim 21.

25. A method for filtering energy of an electron beam, comprising the steps of:

deflecting incident electrons a first deflecting angle WM1 with a first trace radius AM1 and passing a first path of a free space causing no substantial magnetic field through an effect of a first deflection magnetic field;

deflecting said electrons passed through said first path a second deflecting angle WM2 with a second trace radius AM2 through an effect of a second deflection magnetic field and letting said deflected electrons pass through a second path of said free space, said second path being substantially in parallel to said first path;

deflecting said electrons passed through said second path said first deflecting angle with said first trace radius AM1 through the effect of said first deflection magnetic field and letting said deflected electrons to outgo in the substantially same direction as said incident electrons; and deflecting said outgo electrons due to said first deflection magnetic field to the substantially same direction as the incident direction of said incident electrons incident onto said first deflection magnetic field.

* * * * *